(12) United States Patent
Sakata et al.

(10) Patent No.: US 7,521,855 B2
(45) Date of Patent: Apr. 21, 2009

(54) ELECTRONIC APPLIANCE AND LIGHT-EMITTING DEVICE

(75) Inventors: Junichiro Sakata, Kanagawa (JP); Hisao Ikeda, Kanagawa (JP); Takahiro Kawakami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/291,312

(22) Filed: Dec. 1, 2005

(65) Prior Publication Data

US 2006/0119258 A1      Jun. 8, 2006

(30) Foreign Application Priority Data

Dec. 6, 2004     (JP)     ............... 2004-353427

(51) Int. Cl.
*H05B 33/00*     (2006.01)
(52) U.S. Cl. .................. 313/504; 313/506; 428/917
(58) Field of Classification Search ................. 313/506, 313/498, 504, 503, 483
See application file for complete search history.

(56) References Cited

U.S. PATENT DOCUMENTS

| | | | | |
|---|---|---|---|---|
| 5,783,292 | A * | 7/1998 | Tokito et al. .................. 428/212 |
| 6,288,487 | B1 * | 9/2001 | Arai .............................. 313/506 |
| 6,576,351 | B2 * | 6/2003 | Silvernail ...................... 428/690 |
| 6,614,175 | B2 * | 9/2003 | Aziz et al. .................... 313/504 |
| 6,720,203 | B2 * | 4/2004 | Carcia et al. .................. 438/99 |
| 6,872,973 | B1 | 3/2005 | Koyama et al. ............... 257/59 |
| 6,919,681 | B2 * | 7/2005 | Cok et al. ...................... 313/500 |
| 6,965,197 | B2 * | 11/2005 | Tyan et al. ..................... 313/506 |
| 7,158,161 | B2 | 1/2007 | Gyoutoku et al. |
| 7,170,176 | B2 * | 1/2007 | Ishikawa et al. ............... 257/758 |
| 2002/0043930 | A1 * | 4/2002 | Takeishi et al. ............... 313/506 |
| 2002/0180671 | A1 | 12/2002 | Inukai ........................... 345/76 |
| 2003/0146693 | A1 * | 8/2003 | Ishihara et al. ................ 313/504 |
| 2004/0027059 | A1 | 2/2004 | Tsutsui ......................... 313/504 |
| 2004/0070335 | A1 * | 4/2004 | Cok .............................. 313/506 |
| 2004/0242116 | A1 * | 12/2004 | Forrest et al. ................. 445/25 |
| 2005/0072977 | A1 | 4/2005 | Saito et al. .................... 257/72 |
| 2005/0073247 | A1 * | 4/2005 | Yamazaki et al. ............ 313/503 |
| 2005/0084712 | A1 | 4/2005 | Kido et al. |

(Continued)

FOREIGN PATENT DOCUMENTS

EP     1 094 436 A2     4/2001

(Continued)

OTHER PUBLICATIONS

U.S. Appl. No. 10/581,410 to Kumaki, filed Jun. 1, 2006, (pending) including specification, claims and drawings as filed.

*Primary Examiner*—Ashok Patel
(74) *Attorney, Agent, or Firm*—Cook Alex Ltd.

(57) ABSTRACT

An EL element having a novel structure is provided, which is suitable for AC drive. A light-emitting element of the invention is provided with material layers (material layers each having approximately symmetric I-V characteristics with respect to the zero point in a graph having the abscissa axis showing current values and the ordinate axis showing voltage values) between a first electrode and a layer including an organic compound and between the layer including the organic compound and a second electrode respectively. Specifically, each of the material layers is a composite layer including a metal oxide and an organic compound.

20 Claims, 9 Drawing Sheets

U.S. PATENT DOCUMENTS

| | | |
|---|---|---|
| 2005/0098207 A1 | 5/2005 | Matsumoto et al. |
| 2005/0162356 A1 | 7/2005 | Koyama et al. ............... 345/76 |
| 2005/0248267 A1 | 11/2005 | Gyoutoku et al. |
| 2006/0027830 A1 | 2/2006 | Kumaki et al. |
| 2006/0152144 A1* | 7/2006 | Nakaya et al. ............... 313/504 |
| 2006/0159955 A1* | 7/2006 | Inoue et al. .................. 428/690 |
| 2006/0186804 A1* | 8/2006 | Sakakura et al. ............ 313/506 |
| 2007/0114512 A1 | 5/2007 | Kumaki et al. |
| 2007/0114527 A1 | 5/2007 | Kumaki et al. |
| 2007/0131948 A1 | 6/2007 | Seo et al. |
| 2007/0159082 A1 | 7/2007 | Ikeda et al. |
| 2007/0170847 A1 | 7/2007 | Kumaki et al. |
| 2008/0093984 A1* | 4/2008 | Yoshitake et al. ........... 313/504 |

FOREIGN PATENT DOCUMENTS

| | | |
|---|---|---|
| EP | 1 388 904 A2 | 2/2004 |
| EP | 1 524 706 A2 | 4/2005 |
| EP | 1 530 245 A2 | 5/2005 |
| JP | 9-63771 | 3/1997 |
| JP | 2824411 | 11/1998 |
| JP | 11-307259 | 11/1999 |
| JP | 2001-222255 | 8/2001 |
| JP | 2004-095546 | 3/2004 |
| JP | 2005-26121 | 1/2005 |
| WO | WO 2005/006460 A1 | 1/2005 |
| WO | WO 2005/031798 A1 | 4/2005 |
| WO | WO 2005/031798 A2 | 4/2005 |
| WO | WO 2005/064995 A1 | 7/2005 |
| WO | WO 2006/009262 A1 | 1/2006 |
| WO | WO 2006/038573 A1 | 4/2006 |
| WO | WO 2006/049323 A1 | 5/2006 |
| WO | WO 2006/062177 A1 | 6/2006 |

* cited by examiner

ELECTRONIC APPLIANCE AND LIGHT-EMITTING DEVICE

BACKGROUND OF THE INVENTION

1. Field of the Invention

The present invention relates to an organic light-emitting element having an anode, a cathode and a layer including an organic compound, which emits light when an electronic field is applied thereto (hereinafter referred to as an 'electroluminescent layer'), and a light-emitting device using such an organic light-emitting element. In addition, the invention relates to an electronic appliance mounted with the light-emitting device having an organic light-emitting element as its component.

2. Description of the Related Art

In recent years, a light-emitting device having an EL element as a self-luminous element has been actively developed. This light-emitting device is also called an organic EL display or an organic light-emitting diode. Such a light-emitting device has advantages in that low-voltage and low-power-consumption drive can be performed with high response speed which is suitable for displaying moving images. Therefore, the light-emitting device has been attracting attention as a next-generation display such as a new-generation portable phone or portable information terminal (PDA).

The light-emitting element has a pair of electrodes (an anode and a cathode) and an electroluminescent layer interposed therebetween. It is said that light emission is obtained when a hole injected from the anode and an electron injected from the cathode upon application of an electronic field to the both electrodes are recombined in the luminescent center of the electroluminescent layer, thereby a molecular exciton is formed to release energy in returning to the ground state.

The organic EL display having a light-emitting element is a self-luminous type differently from a liquid crystal display which requires a backlight, thus it has no problem with regard to the viewing angle. That is, the organic EL display is more suitable for a display for outdoor use than a liquid crystal display, and various applications thereof have been proposed.

A driving method of the organic EL display can be roughly classified into Direct Current (DC) drive and Alternate Current (AC) drive.

The present applicant has disclosed Patent Document 1 in which AC drive is used in an active matrix display device having an EL element, and disclosed Patent Document 2 in which an EL element is used for the AC drive.

[Patent Document 1] Japanese Patent Laid-Open No. 2001-222255

[Patent Document 2] Japanese Patent Laid-Open No. 2004-95546

When AC drive is performed, an AC signal (signal of which voltage level is inverted in regular cycles) is applied to a pair of electrodes of an EL element. In the case where the EL element has a simple structure such as a stacked-layer structure of a first electrode, a second electrode and a layer including an organic compound interposed therebetween, light emission is obtained only in a half cycle when an AC signal is applied thereto due to the rectifying function. Accordingly, in order to obtain about an equal amount of light to the case of performing DC drive in which DC voltage is applied to the EL element, power consumption is increased.

SUMMARY OF THE INVENTION

It is a primary object of the invention to provide an EL element having a novel structure which is suitable for AC drive.

A light-emitting element according to the invention has a novel structure suitable for the AC drive, where material layers (material layers each having approximately symmetric current-voltage (I-V) characteristics with respect to the zero point in a graph having the abscissa axis showing current values and the ordinate axis showing voltage values) are provided between a first electrode and a layer including an organic compound and between the layer including the organic compound and a second electrode respectively.

The material layers having the aforementioned I-V characteristics have both a hole injection (a hole transporting) property and an electron injection (or electron transporting) property, and one of the properties becomes dominant in accordance with an AC signal applied.

An applied AC signal has, as shown in an example of a waveform in FIG. 13, the same absolute value of voltage on the positive side and the negative side. Therefore, the luminance of an EL element in a half cycle in which a positive voltage is applied is required to be equal to the luminance of the EL element in another half cycle in which a negative voltage is applied. Thus, according to the invention, by using material layers each having approximately symmetric I-V characteristics with respect to the zero point in a graph having the abscissa axis showing current values and the ordinate axis showing voltage values, an EL element can be controlled to emit light in accordance with both positive and negative signals being applied. Further, about an equal amount of light to the case of performing DC drive in which DC voltage is applied to the EL element can be obtained without increasing power consumption.

A light-emitting device in accordance with the structure of the invention includes a plurality of light-emitting elements. Each of the light-emitting elements includes a first electrode; a first material layer formed over the first electrode; a layer including an organic compound formed over the first material layer; a second material layer formed over the layer including the organic compound; and a second electrode formed over the second material layer. The first material layer has approximately symmetric I-V characteristics with respect to the zero point in a graph having the abscissa axis showing current values and the ordinate axis showing voltage values, and the second material layer has the same I-V characteristics as the first material layer.

In the aforementioned structure, each of the first material layer and the second material layer is a composite layer of an organic compound and an inorganic compound which can give/receive electrons to/from the organic compound. Specifically, it is a composite layer including a metal oxide and an organic compound.

In the aforementioned structure, the metal oxide is one or more of molybdenum oxide, tungsten oxide and rhenium oxide.

The aforementioned first and second material layers can have excellent conductivity in addition to an effect (improvement in heat resistance and the like) which is considered to be obtained by mixing an inorganic compound therewith. Such effects cannot be obtained only by mixing an organic compound and an inorganic compound having no electronic mutual interaction with each other like a conventional hole transporting layer.

The aforementioned first and second material layers can be formed thick without causing an increase in the driving voltage; therefore, a short circuit of elements which derives from dust or the like in the formation process of the EL element can be suppressed, thereby the yield can be improved.

Needless to say, the aforementioned first and second material layers may be formed using materials having different compositions as long as the materials have the aforementioned I-V characteristics. The aforementioned first and second material layers are not specifically required to have the same thickness.

Since the material layers having the aforementioned I-V characteristics have both the hole injection (or hole transporting) property and the electron injection (or electron transporting) property, the structure of the EL element can be simplified. For example, such a complex structure is not required that a layer which emits light per half cycle in accordance with an AC signal be provided between a pair of electrodes, thereby a manufacturing process can be simplified.

In the light-emitting device having the aforementioned structure, a driver circuit for applying an AC signal between the first electrode and the second electrode is provided. If a video signal of which positive/negative levels are inverted in regular cycles is applied between the first electrode and the second electrode of the light-emitting device, image display can be performed as an organic EL display. Note that the regular cycle defined herein is based on the cycle of a vertical synchronizing signal or a horizontal synchronizing signal. For example, the regular cycle is set to be equal to or longer than 1/60 seconds. If the regular cycle is set to be shorter then 1/60 seconds, the light-emitting device can be more suitable for displaying moving images.

Note that a light-emitting device in this specification means an image display device, a light-emitting device and a light source (including a lighting device). In addition, the light-emitting device includes all of a module in which a light-emitting device is connected to a connector such as an FPC (Flexible Printed Circuit), a TAB (Tape Automated Bonding) tape or a TCP (Tape Carrier Package), a module in which a printed wiring board is provided on the tip of a TAB tape or a TCP, and a module in which an IC (Integrated Circuit) is directly mounted onto a light-emitting element by COG bonding.

According to the invention, a light-emitting device suitable for AC drive can be realized without complicating an element structure.

BRIEF DESCRIPTION OF THE DRAWINGS

FIG. 14A is a graph showing the I-V characteristics in the case of using a single organic compound layer while

DETAILED DESCRIPTION OF THE INVENTION

Figure 1:
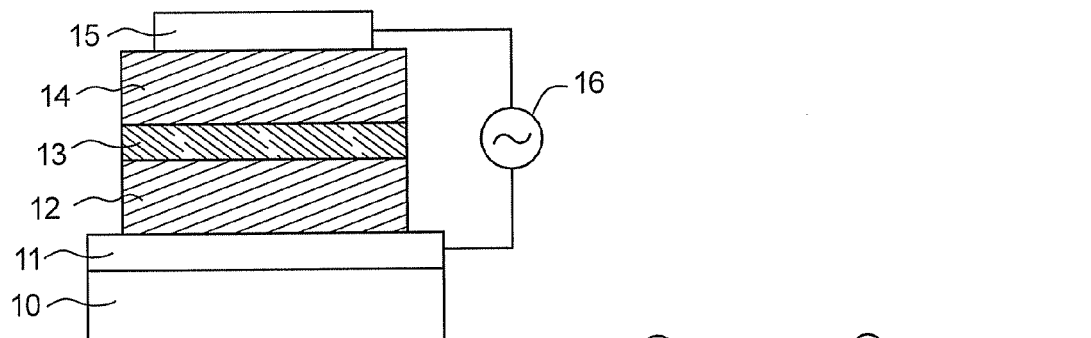
FIG. 1 illustrates an example of a structure of a light-emitting element of the invention.

Although the invention will be fully described by way of embodiment mode and embodiments with reference to the accompanying drawings, it is to be understood that various changes and modifications will be apparent to those skilled in the art. Therefore, unless otherwise such changes and modifications depart from the scope of the invention, they should be construed as being included therein. FIG. 1 shows an example of a stacked-layer structure of a light-emitting element of the invention.

FIG. 1 shows a structure in which a first electrode 11, a first material layer 12, a layer including an organic compound 13, a second material layer 14 and a second electrode 15 are stacked in this order over a substrate 10 having an insulating surface. Note that an AC power source 16 is connected to the first electrode 11 and the second electrode 15 so that the layer including an organic compound 13 emits light.

One or both of the first electrode 11 and the second electrode 15 are formed using a light-transmissive conductive film. As a light-transmissive conductive film, ITO, IZO, ITSO or the like may be used. Each of the first electrode 11 and the second electrode 15 is formed with a thickness of 10 to 500 nm. If the first electrode 11 and the second electrode 15 are each thinner than 10 nm, they do not function as the electrodes since the conductivity is drastically lowered. Meanwhile, if the first electrode 11 and the second electrode 15 are each thicker than 500 nm, light transmissivity is lowered.

In the case of using a metal film as the first electrode 11 or the second electrode 15, Ag, Al, Ta or the like may be used.

Each of the first material layer 12 and the second material layer 14 is formed using a material having approximately symmetric I-V characteristics with respect to the zero point in a graph having the abscissa axis showing current values and the ordinate axis showing voltage values. Specifically, each of the first material layer 12 and the second material layer 14 is formed as a composite layer of a metal oxide (e.g., molybdenum oxide, tungsten oxide or rhenium oxide) and an organic compound material having a hole transporting property (e.g., N,N'-bis(3-methylphenyl)-N,N'-diphenyl-1,1'-biphenyl-4, 4'-diamine (abbreviated as TPD), 4,4'-bis[N-(1-napthyl)-N-phenyl-amino]biphenyl (abbreviated as a-NPD) or 4,4'-bis [N-[4-{N,N-bis(3-methylphenyl)amino}phenyl]-N-phenylamino]biphenyl (abbreviated as DNTPD)).

The thickness of the first material layer 12 and the second material layer 14 is each set in the range of 3 to 1000 nm. If these layers are thinner than 3 nm, they cannot be formed over the entire surface. Meanwhile, if these layers are thicker than 1000 nm, the light transmissivity is drastically lowered.

The layer including the organic compound 13 may have either a single layer or stacked layers, and the thickness of each layer included in the layer including the organic compound 13 is set in the range of 5 to 500 nm. In the structure of the light-emitting element in FIG. 1, an even simpler stacked-layer structure is obtained in the case of adopting a single layer.

The layer including the organic compound 13 may be formed using, for example, tris(8-quinolinolato) aluminum (abbreviated as $Alq_3$), tris(4-methyl-8-quinolinolato) aluminum (abbreviated as $Almq_3$) or a-NPD. Alternatively, the layer including the organic compound 13 may be formed to contain a dopant material such as N,N'-dimethyl quinacridone (abbreviated as DMQd), Coumarin 6 or rubrene.

The layer including the organic compound 13 is preferably formed using a material having a highest occupied molecular orbital (HOMO) and a lowest unoccupied molecular orbital (LUMO) of which levels are within the range of a bandgap of the metal oxides contained in the first material layer 12 and the second material layer 14.

In addition, each material of the first electrode 11 and the second electrode 15 preferably has a work function within the range of a bandgap of the metal oxides contained in the first material layer 12 and the second material layer 14.

Description is made below on the operating mechanism of light emission in which an AC signal is applied to the light-emitting element shown in FIG. 1 from the AC power source 16 and light emission is obtained by utilizing energy levels shown in FIGS. 2 and 3. Note that portions in FIGS. 2 and 3 which correspond to those in FIG. 1 are denoted by the same reference numerals.

Figure 2:
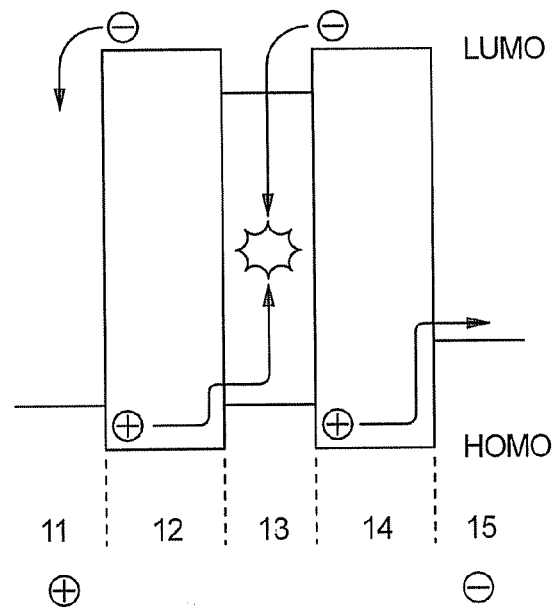
FIG. 2 illustrates an operating mechanism of a light-emitting element of the invention.

FIG. 2 shows an example of the state of energy levels where the first electrode 11 of the light-emitting element is formed of ITO while the second electrode 15 thereof is formed of Al.

When a voltage is applied between the first electrode 11 and the second electrode 15, charges are generated in the first material layer 12 and the second material layer 14. Among the charges generated in the first material layer 12 in contact with the first electrode 11, electrons move to the first electrode 11 whereas holes are injected into the layer including the organic compound 13.

On the other hand, among the charges generated in the second material layer 14 in contact with the second electrode 15, electrons are injected into the layer including the organic compound 13 whereas holes move to the second electrode 15.

In this manner, the holes injected from the first material layer 12 and the electrons injected from the second material layer 14 are recombined to emit light in the layer including the organic compound 13.

Figure 3:
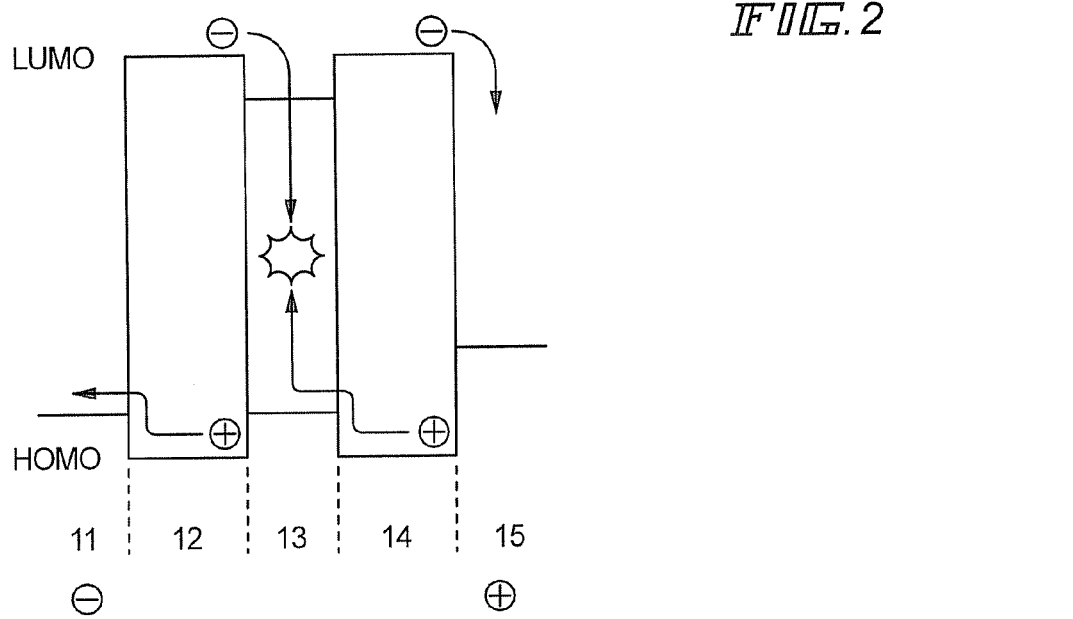
FIG. 3 illustrates an operating mechanism of a light-emitting element of the invention.

FIG. 3 shows the state of energy levels in which a signal having an opposite voltage level (positive or negative voltage) to the one shown in FIG. 2 is applied. Even when a signal having the opposite voltage level is applied, light emission is similarly obtained in the layer including the organic compound 13 since the element structure is the same.

As set forth above, when an AC signal is applied to the light-emitting element of the invention, light emission can be obtained not only in a half cycle in which either a positive or negative voltage is applied but also in another half cycle in which a voltage having the opposite level is applied.

Figure 4:
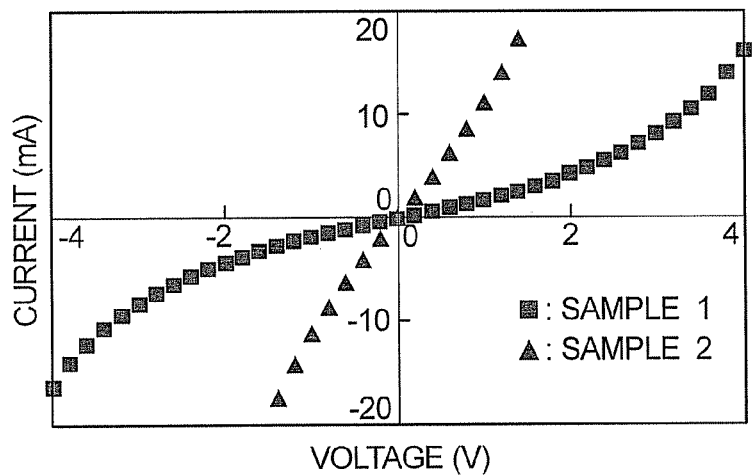
FIG. 4 is a graph showing the I-V characteristics of a material layer of the invention.

FIG. 4 shows a result obtained from the following experiment.

A sample 1 (a stack of an ITSO film, a composite film obtained by simultaneously vapor-depositing molybdenum oxide, DNTPD and rubrene at an arbitrary ratio, and an aluminum film, which is formed over a glass substrate) and a sample 2 (a stack of an ITSO film, a composite film obtained by simultaneously vapor-depositing molybdenum oxide, BBPB and rubrene at an arbitrary ratio, and an aluminum film, which is formed over a glass substrate) are manufactured.

Current and voltage are applied to the sample 1 and the sample 2, each of which is plotted in a graph having the abscissa axis showing current values and the ordinate axis showing voltage values.

It can be seen from the graph shown in FIG. 4 that the material layer interposed between a pair of electrodes (the ITSO film and the aluminum film) of the sample 1 has approximately symmetric I-V characteristics with respect to the zero point. Similarly, the material layer of the sample 2 has approximately symmetric I-V characteristics with respect to the zero point.

Figure 14A:
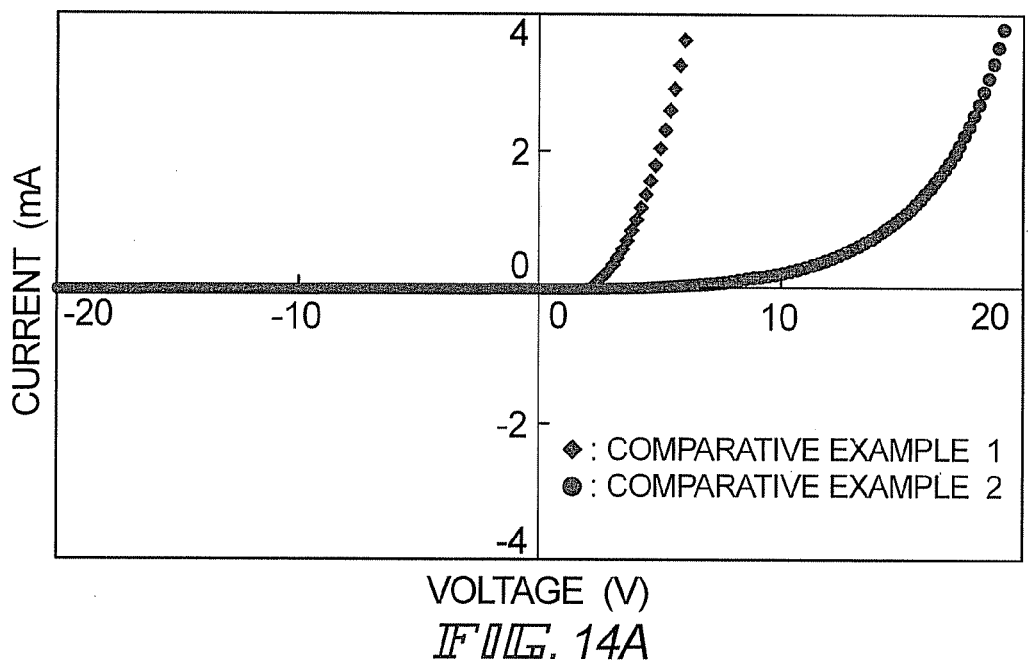

As a comparative example 1, FIG. 14A shows a result obtained by measuring the I-V characteristics after stacking an ITSO film, a DNTPD film and an aluminum film over a glass substrate. In addition, as a comparative example 2, FIG. 14A also shows a result obtained by measuring the I-V characteristics after stacking an ITSO film, a BBPB film and an aluminum film over a glass substrate. As shown in FIG. 14A, when an organic compound film having a single layer is interposed between a pair of electrodes, current flows only when a positive voltage is applied thereto.

Figure 14B:
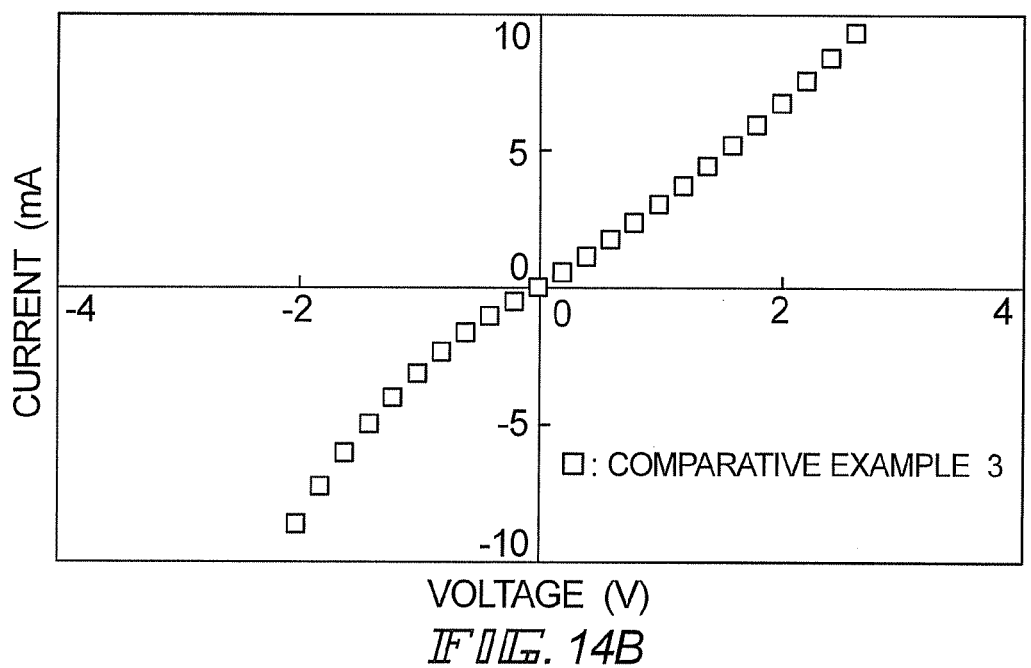
FIG. 14B is a graph showing the I-V characteristics in the case of using a single molybdenum oxide layer (comparative example).

As a comparative example 3, FIG. 14B shows a result obtained by measuring the I-V characteristics after stacking an ITSO film, a molybdenum oxide film and an aluminum film over a glass substrate. As shown in FIG. 14B, when a molybdenum oxide film having a single layer is interposed between a pair of electrodes, symmetric I-V characteristics with respect to the zero point are not obtained.

In the following embodiments, mode detailed description is made on the structure of the invention.

Embodiment 1

Figure 5A:
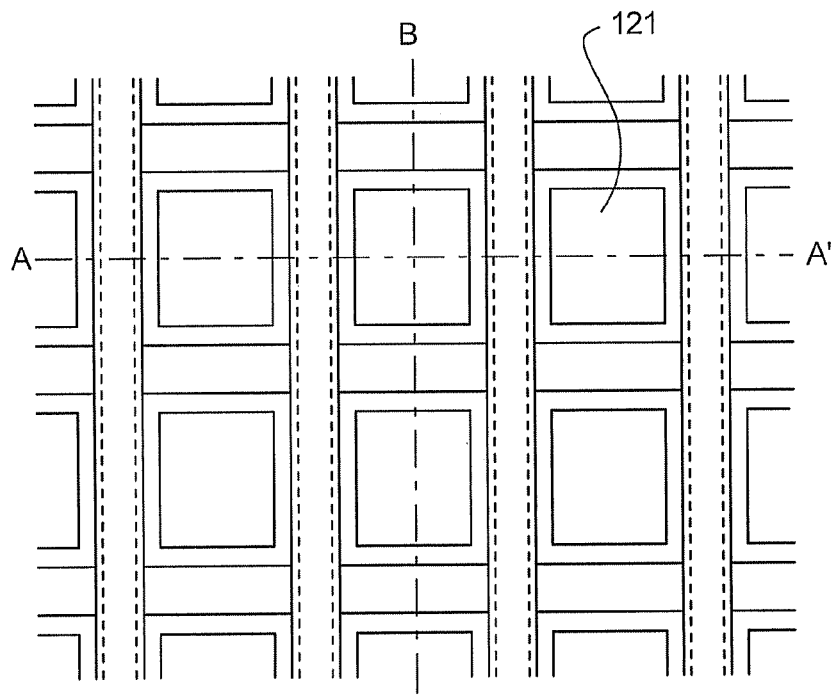
FIG. 5A illustrates a top structure of a passive display device and FIGS. 5B and 5C illustrate cross-sectional structures thereof.
Figure 5C:
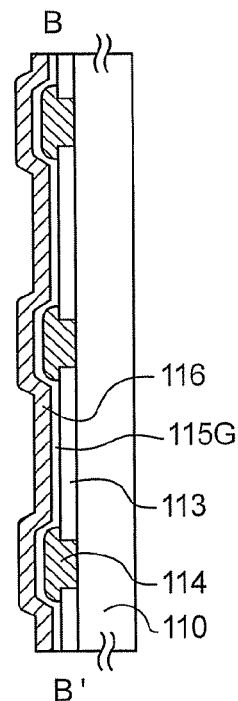
Figure 5B:
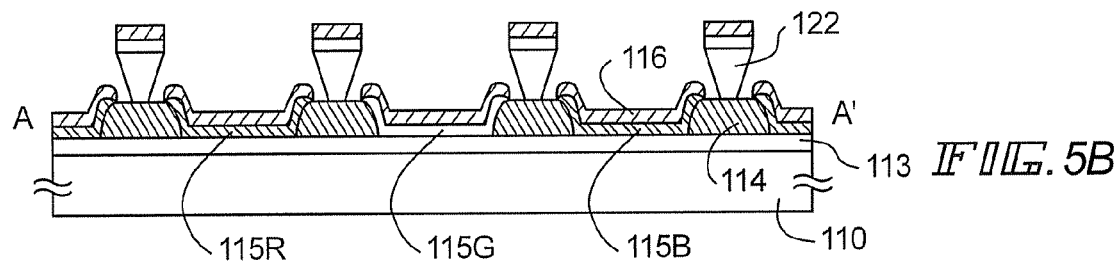

FIGS. 5A to 5C show an example where the structure of a light-emitting element of the invention is used as a light-emitting element of a passive matrix display device.

FIG. 5A is a top view of a pixel portion before being sealed, FIG. 5B is a cross-sectional view along a dashed line A-A' of FIG. 5A, and FIG. 5C is a cross-sectional view along a dashed line B-B' of FIG. 5A.

Over a first substrate 110, a plurality of first electrodes 113 are disposed in stripes at regular intervals. Over each of the first electrodes 113, a partition wall 114 having an opening corresponding to each pixel is provided. The partition wall 114 having an opening is formed of a photosensitive or non-photosensitive organic material (e.g., polyimide, acrylic, polyamide, polyimide amide, resist or benzocyclobutene), or an SOG film (e.g., a $SiO_x$ film containing an alkyl group). Note that the opening corresponding to each pixel is a light-emitting region 121.

Over the partition walls 114 each having an opening, a plurality of inversely tapered partition walls 122 are provided in parallel, which extend in a direction to intersect the first electrodes 113. The inversely tapered partition walls 122 are formed by photolithography using a positive photosensitive resin (by which an unexposed portion remains as a pattern) and controlling the amount of light exposure or developing time in such a manner that a portion below the pattern is, etched more.

Figure 6:
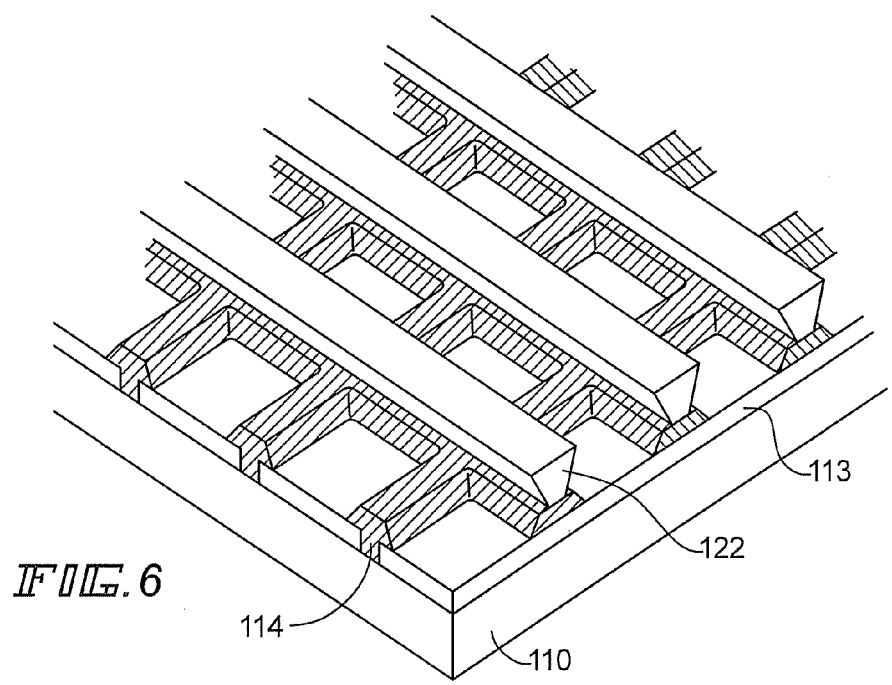
FIG. 6 is a perspective view after the formation of inversely tapered partition walls.

FIG. 6 shows a perspective view immediately after forming the plurality of inversely tapered partition walls 122 in parallel. Note that the identical portions to those in FIGS. 5A to 5C are denoted by the same reference numerals.

The inversely tapered partition walls 122 are formed to be higher than the thickness of a layer including an organic compound and a conductive film. When a layer including an organic compound and a conductive film are stacked over the first substrate having a structure shown in FIG. 6, they are separated into a plurality of regions which are electrically isolated from each other, thereby layers (each including an organic compound) 115R, 115G and 115B and second electrodes 116 are formed as shown in FIGS. 5A to 5C. The second electrodes 116 are striped electrodes which are provided in parallel and extend in a direction to intersect the first electrodes 113. Note that the layer including the organic compound and the conductive film are also formed over the inversely tapered partition walls 122; however, they are separated from the layers (each including an organic compound) 115R, 115G and 115B and the second electrodes 116.

This embodiment illustrates an example where the stacked layers 115R, 115G and 115B each having a first composite layer including a metal oxide and an organic compound, a layer including an organic compound, and a second composite layer including a metal oxide and an organic compound are selectively formed over the first electrode, so that a light-emitting device capable of performing full color display is provided where three kinds of light emission (red, green and blue colors) can be provided. The stacked layers 115R, 115G and 115B are each formed in parallel with a stripe pattern. Although each stacked layer has the same pattern here, the first composite layer and the second composite layer may be formed as a common layer to each light-emitting element while only a layer including an organic compound to be a light-emitting layer may be selectively deposited using a vapor-deposition mask.

An example of depositing a first composite layer including a metal oxide and an organic compound is shown. First, NPB and molybdenum oxide are stored in separate evaporation sources of resistance heating type, and they are vapor-deposited onto a substrate having a first electrode which is set inside an evacuated vapor-deposition system. At vapor deposition, NPB is vapor-deposited at a deposition rate of 0.4 nm/s while molybdenum oxide is vapor-deposited at an amount of 1/4 (weight ratio) relatively to NPB. In this case, in terms of a molar ratio, NPB:molybdenum oxide is 1:1. The first composite layer including a metal oxide and an organic compound has a thickness of 50 nm.

Over the first composite layer, PPD (4,4'-bis(N-phenanthryl)-N-phenylamino)biphenyl) doped with CBP (4,4'-N,N'-dicarbazole-biphenyl) is deposited with a thickness of 30 nm as a blue light-emitting layer in a region for forming a blue light-emitting element.

In a region for forming a red light-emitting element, $Alq_3$ doped with DCM is deposited with a thickness of 40 nm as a red light-emitting layer.

In a region for forming a green light-emitting element, $Alq_3$ doped with DMQD is deposited with a thickness of 40 nm as a green light-emitting layer.

Then, a second composite layer including a metal oxide and an organic compound is formed over the blue light-emitting layer, the red light-emitting layer and the green light-emitting layer. The second composite layer is obtained by vapor-depositing NPB and molybdenum oxide similarly to the first composite layer. The second composite layer is also formed with a thickness of 50 nm. Note that the luminous efficiency may be improved by appropriately changing the thickness of the first composite layer and the second composite layer for each light-emission color.

in addition, a light-emitting device capable of performing full color display may be formed, where four kinds of light emission (red, green, blue and white) can be provided. Alternatively, a light-emitting device capable of performing full color display may be formed, where four kinds of light emission (red, green, blue and emerald green) can be provided.

Further alternatively, a light-emitting device capable of performing full color display may be formed, where five kinds of light emission (red, green, blue, white and emerald green) can be provided. In addition, a light-emitting device capable of performing full color display may be formed, where five kinds of light emission (red, green, blue, emerald green and orange) can be provided.

Alternatively, the layers may be stacked over the entire surface and monochromatic light-emitting elements may be provided so that a light-emitting device capable of performing monochromatic display can be provided, or a light-emitting device capable of performing area color display can be provided. In addition, by combining a light-emitting device which provides white light emission with color filters, a light-emitting device capable of performing full color display may be formed.

The light-emitting element is sealed by attaching a second substrate to the first substrate with a sealant. A protective film for covering the second electrode 116 may be formed as required. Note that the second substrate is preferably a substrate having a high barrier property against moisture. In addition, a drying agent may be disposed in a region surrounded by the sealant as required.

In the case where the first electrode 113 is formed using a light-reflective conductive material and the second electrode 116 is formed using a light-transmissive conductive material, a top-emission light-emitting device can be provided where light emitted from light-emitting elements is extracted through the second substrate. The first electrode 113 is preferably formed using an aluminum alloy film containing carbon and nickel in a single layer or using an aluminum alloy film containing carbon and nickel as a bottom layer of a stack with a light-transmissive conductive film since the contact resistance value of the aluminum alloy film with ITO or ITSO does not fluctuate much even after current is applied thereto or heat treatment is applied.

In the case where the first electrode 113 is formed using a light-transmissive conductive material and the second electrode 116 is formed using a light-reflective conductive material, a bottom-emission light-emitting device can be provided where light emitted from light-emitting elements is extracted through the first substrate 110.

In the case where both the first electrode 113 and the second electrode 116 are formed using a light-transmissive conductive material, a dual-emission display device can be provided where light emitted from light-emitting elements is extracted through both the second substrate and the first substrate.

Figure 7:
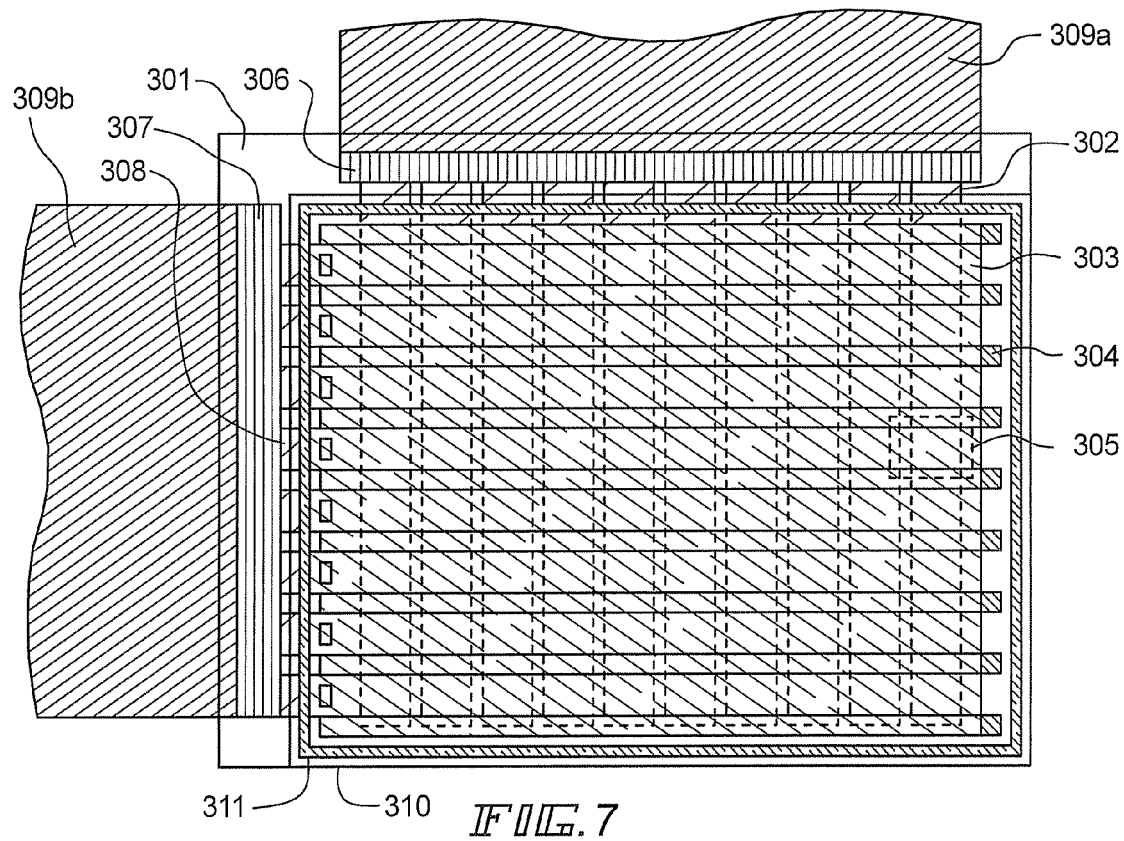
FIG. 7 is a top external view of a light-emission module.

FIG. 7 is a top view of a light-emitting module on which an FPC and the like are mounted after sealing.

A first substrate 301 and a second substrate 310 are attached with a sealant 311 to face each other. The sealant 311 may be a photo-curing resin, and preferably a material having a low degasification property and a low hygroscopic property. A filler (spacer in a stick form or fiber form) or a spherical spacer may be added to the sealant 311 in order to keep a constant gap between the substrates. Note that the second substrate 310 is preferably formed using a material which has the identical thermal expansion coefficient to that of the first substrate 301, and glass (including quartz glass) or plastic may be used.

In the pixel portion for displaying images, scan lines and data lines intersect each other as shown in FIG. 7.

The first electrode 113 in FIG. 5B corresponds to a data line 302 in FIG. 7, the second electrode 116 corresponds to a scan line 303, and the inversely tapered partition wall 122 corresponds to a partition wall 304. A stack including an organic compound is interposed between the data line 302 and the scan line 303, and an intersection denoted by 305 corresponds to one pixel.

Note that the scan line 303 is electrically connected at its end to a connecting wire 308, and the connecting wire 308 is connected to an FPC 309b through an input terminal 307. The data line 302 is connected to an FPC 309a through an input terminal 306.

If necessary, a polarizing plate, a circularly polarizing plate (including an elliptically polarizing plate) or a retardation plate (a λ/4 plate or a λ/2 plate) and an optical film such as a color filter may be appropriately provided on the light-emitting surface. Further, the polarizing plate or the circulary polarizing plate may be provided with an anti-reflection film. For example, anti-glare treatment may be carried out by which reflected light can be diffused by projections/depressions on the surface so as to reduce the glare. In addition, anti-reflection treatment by heat treatment may be applied to the polarizing plate or the circulary polarizing plate. After that, hard coat treatment is preferably applied in order to protect the light-emitting module from external shocks. Note that the provision of a polarizing plate or a circulary polarizing plate will reduce the light extraction efficiency. Further, the polarizing plate or the circulary polarizing plate itself is expensive and easily deteriorates.

The light-emitting module shown in FIG. 7 which is obtained in this manner is driven with AC voltage. A light-emitting element of the invention can emit light, even when driven with AC voltage, with both a positive signal and a negative signal being applied. Further, about an equal amount of light to the case of performing DC drive in which DC voltage is applied can be obtained without increasing power consumption.

This embodiment can be freely implemented in combination with Embodiment Mode.

Embodiment 2

In this embodiment, description is made on an example of manufacture of a light-emitting module on which an IC chip is mounted.

First, data lines (anodes) 402 each having a stacked-layer structure of a reflective metal film as a bottom layer and a light-transmissive conductive oxide film as a top layer are formed over a first substrate 401 having an insulating surface. At the same time, connecting wires 408, 409a and 409b and an input terminal are formed.

Subsequently, partition walls each having an opening corresponding to each pixel 405 are formed. Then, a plurality of inversely tapered partition walls 404 which are in parallel with each other and intersect the data lines 402 are provided over the partition walls each having an opening.

Figure 8A:
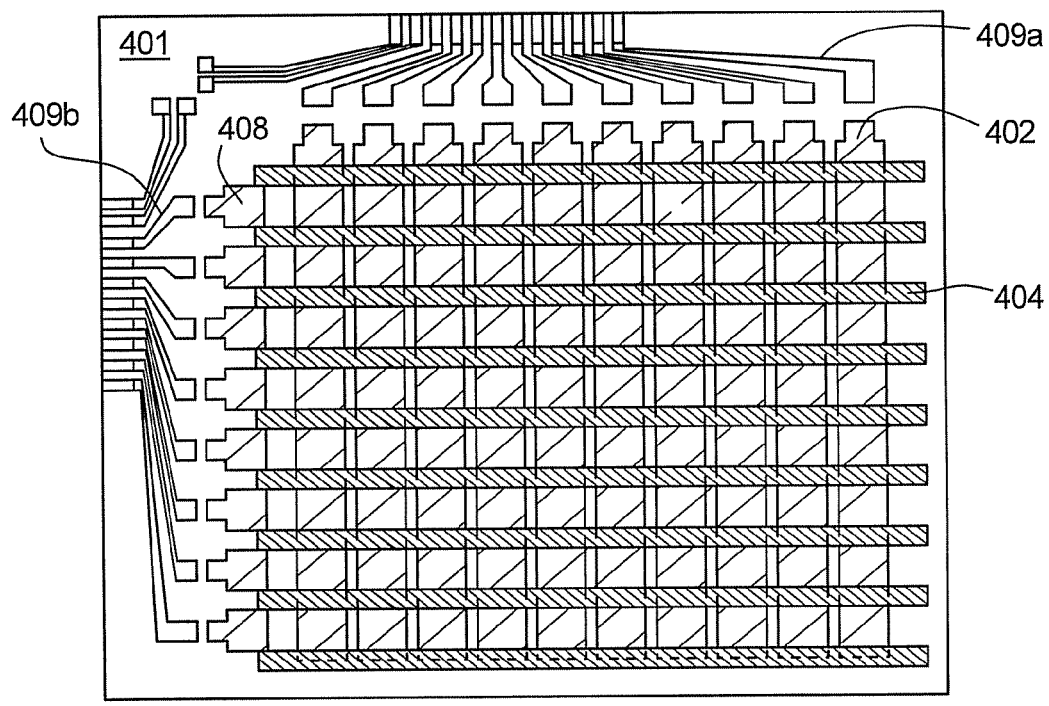
FIGS. 8A and 8B are top views of a light-emitting module.

FIG. 8A shows a top view obtained through the aforementioned steps.

Figure 8B:
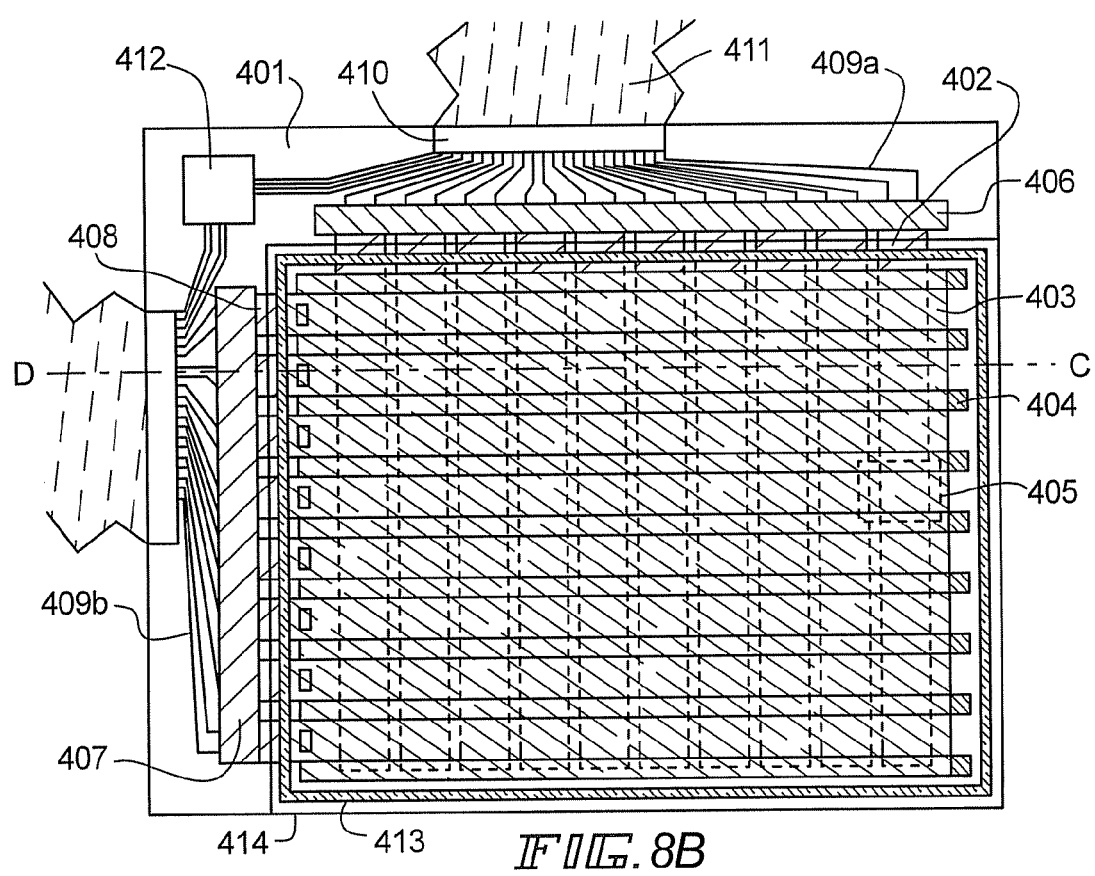

Then, a first composite layer including a metal oxide and an organic compound, a layer including an organic compound, a second composite layer including a metal oxide and an organic compound, and a light-transmissive conductive film are sequentially stacked, so that the layers are separated into a plurality of regions which are electrically insulated from each other as shown in FIG. 8B, thereby a layer including an organic compound and scan lines 403 formed of a light-transmissive conductive film are formed. The scan lines 403 formed of the light-transmissive film are striped electrodes which are in parallel with each other and extend in a direction to intersect the data lines 402.

Then, a light-transmissive second substrate 414 is attached to the first substrate 401 with a sealant 413. Then, a data line side IC 406 and a scan line side IC 407 in each of which a driver circuit for transmitting each signal to the pixel portion is formed are mounted onto a region around (outside) the pixel portion by COG bonding. As an alternative mounting technique to the COG bonding, TCP or wire bonding may be used. TCP is a TAB tape on which an IC is mounted, and the IC is mounted by connecting the TAB tape to wires on the element forming substrate. Each of the data line side IC 406 and the scan line side IC 407 may be formed using a silicon substrate. Alternatively, it may be a driver circuit formed using TFTs over a glass substrate, a quartz substrate or a plastic substrate. Although shown here is an example in which a single IC is provided on one side, a plurality of ICs may be provided on one side.

Note that the scan lines 403 are electrically connected at their ends to the connecting wire 408, and the connecting wire 408 is connected to the scan line side IC 407. This is because it is difficult to provide the scan line side IC 407 over the inversely tapered partition walls 404.

The data line side IC 406 provided with the aforementioned structure is connected to an FPC 411 through the connecting wire 409a and an input terminal 410. The scan line side IC 407 is connected to an FPC through the connecting wire 409b and an input terminal.

Further, an IC chip 412 (e.g., a memory chip, a CPU chip or a power source circuit chip) is mounted to achieve higher integration.

Figure 9:
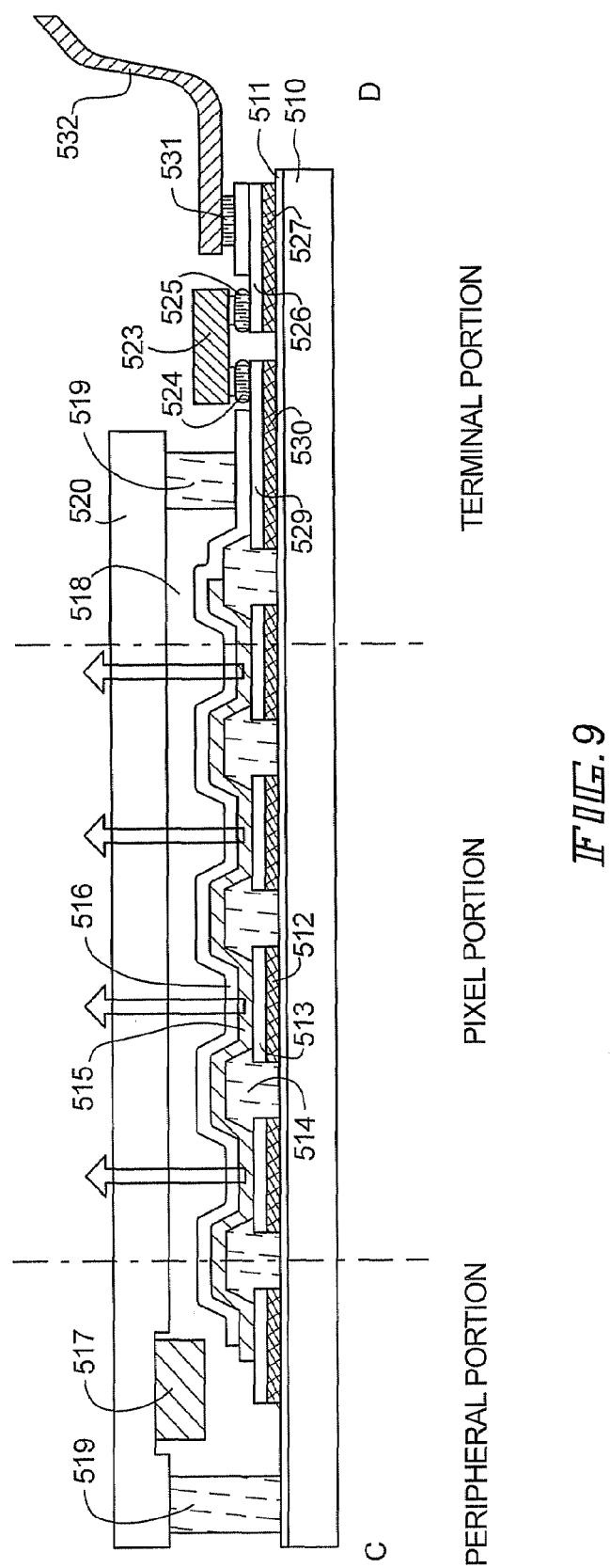
FIG. 9 is a cross-sectional view of a light-emitting module.

FIG. 9 shows an example of a cross-sectional structure along a dashed line C-D in FIG. 8B.

A base insulating film 511 is provided over a substrate 510, over which data lines each having a stacked-layer structure are formed. A bottom layer 512 is a reflective metal film while a top layer 513 is a light-transmissive conductive oxide film. The top layer 513 is preferably formed using a conductive film having a high work function, for example a light-transmissive conductive material such as indium tin oxide (ITO), indium tin oxide containing Si elements (ITSO) or IZO (Indium Zinc Oxide) obtained by mixing indium oxide with 2 to 20 wt % of zinc oxide (ZnO), or a film containing a compound of such conductive materials. Above all, ITSO remains to be, even when baked, in an amorphous state without being crystallized unlike ITO. Accordingly, ITSO has higher planarity than ITO, and does not easily short-circuit to a cathode even when a stack including an organic compound is thin. Thus, ITSO is suitable for an anode of a light-emitting element.

The bottom layer 512 is formed using Ag, Al or an Al(C, Ni) alloy film. Above all, the Al(C, Ni) film (an aluminum alloy film containing carbon and nickel (by 1 to 20 wt %)) is a material which has few fluctuations in the contact resistance value with ITO or ITSO even after current is applied thereto or heat treatment is applied.

A partition wall 514 is a resin for insulating adjacent data lines, and overlaps the boundary or gap between different colored layers (which are provided on the sealing substrate side). A region surrounded by the partition wall has the same area as the light-emitting region.

A layer including an organic compound 515 has a stack of a first composite layer, an EML (light-emitting layer) and a second composite layer in this order from the date line (anode) side.

Each of the first composite layer and the second composite layer is a composite layer including a metal oxide and an organic compound. In this embodiment, a composite layer of tungsten oxide and TPD is used. The EML (light-emitting layer) is formed using a light-emitting substance. At this time, the light-emitting layer may be formed in such a manner that a light-emitting substance is dispersed in a layer containing a substance having a larger energy gap than the energy gap of the light-emitting substance. By dispersing the light-emitting substance, loss of light due to the concentration can be prevented. The light-emitting substance is not specifically limited to a certain type. In the case of obtaining red light emission, a substance which exhibits light emission having a light-emission spectrum with a peak of 600 to 680 nm may be used as the light-emitting substance. For example, there are 4-(dicyano-methylene)-2-isopropyl-6-[2-(1,1,7,7-tetramethyljulolidine-9-yl)ethenyl]-4H-pyran (abbreviated as DCJTI); 4-(dicyano-methylene)-2-methyl-6-[2-(1,1,7,7-tetramethyl-julolidine-9-yl)ethenyl]-4H-pyran (abbreviated as DCJT); 4-(dicyano-methylene)-2-tert-butyl-6-[2-(1,1,7,7-tetramethyl-yljulolidine-9-yl)ethenyl]-4H-pyran (abbreviated as DCJTB); periflanthene; 2,5-dicyano-1,4-bis[2-(10-methoxy-1,1,7,7-tetramethyljulolidine-9-yl)ethenyl]benzene; and the like. In the case of obtaining green light emission, a light-emitting substance which exhibits light emission having a light-emission spectrum with a peak of 500 to 550 nm may be used as the light-emitting substance. For example, there are N,N'-dimethyl quinacridone (abbreviated as DMQd); Coumarin 6; Coumarin 545T; tris(8-quinolinolato) aluminum (abbreviated as $Alq_3$); and the like. In the case of obtaining blue light emission, a light-emitting substance which exhibits light emission having a light-emission spectrum with a peak of 420 to 500 nm may be used as the light-emitting substance. For example, there are 9,10-bis(2-naphthyl)-2-tert-butylanthracene (abbreviated as t-BuDNA); 9,9'-biantolyl,9,10-diphenylanthracene (abbreviated as DPA); 9,10-di(2-naphthyl)anthracene (abbreviated as DNA); bis(2-methyl-8-quinolinolate)-4-phenylphenolate-gallium (abbreviated as BGaq); bis(2-methyl-8-quinolinolate)-4-phenylphenolate-aluminum (abbreviated as BAlq); and the like. In addition, the substance used in combination with the dispersed light-emitting substances is not limited to a certain type either. For example, there are anthracene derivatives such as 9,10-bis(2-naphthyl)-2-tert-butylanthracene (abbreviated as t-BuDNA); carbazole derivatives such as 4,4'-bis(N,N'-carbazole)biphenyl (abbreviated as CBP); a metal complex such as bis[2-(2-hydroxyphenyl)pyridinato]zinc (abbreviated as $Znpp_2$) or bis[2-(2-hydroxyphenyl)benzoxazolato]zinc (abbreviated as ZnBOX); and the like.

Note that the EML may have a stacked-layer structure or a mixed structure as well as a single-layer structure.

A scan line 516 (cathode) is formed to intersect the data line (anode). The scan line 516 (cathode) is formed of a light-transmissive conductive film such as ITO, indium tin oxide containing Si elements (ITSO), and IZO obtained by mixing indium oxide with 2 to 20 wt % of zinc oxide (ZnO). This embodiment illustrates an example of a top-emission light-emitting device where light is emitted through a sealing substrate 520. Therefore, the scan line 516 is required to transmit light.

In order to protect light-emitting elements from damage due to moisture or degasification, a light-transmissive protective film may be provided for covering the scan line 516. The light-transmissive protective film is preferably a dense inorganic insulating film (e.g., a SiN film or a SiNO film) formed by PCVD, a dense inorganic insulating film (e.g., a SiN film or a SiNO film) formed by sputtering, a thin film containing carbon as a main component (e.g., a DLC film, a CN film or an amorphous carbon film), a metal oxide film (e.g., $WO_2$ or $Al_2O_3$), $CaF_2$ or the like.

A pixel portion including light-emitting elements is sealed with sealants 519 and the sealing substrate 520, and the space surrounded therebetween is sealed hermetically.

The sealants 519 may be an ultraviolet-curing resin, a heat-curing rein, a silicone resin, an epoxy resin, an acrylic rein, a polyimide resin, a phenol resin, a PVC (polyvinyl chloride), PVB (polyvinyl butyral) or EVA (ethylene vinyl acetate). In addition, the sealants 519 may be provided with a filler (spacer in a stick form or fiber form) or a spherical spacer.

The sealing substrate 520 is a glass substrate or a plastic substrate. The plastic substrate may be polyimide, polyamide, an acrylic resin, an epoxy resin, PES (polyether sulfone), PC (polycarbonate), PET (polyethylene terephthalate) or PEN (polyethylene naphthalate) in the form of a plate or a film.

Note that a sealed space 518 is filled with a dried inert gas. A slight amount of moisture in the sealed space 518 surrounded by the sealants 519 is removed by a drying agent 517, and thus is sufficiently dried. The drying agent 517 may be a substance which absorbs moisture by chemical adsorption such as an oxide of an alkaline earth metal as typified by calcium oxide or barium oxide. Note that a substance which absorbs moisture by physical adsorption such as zeolite or silica gel may be used as well.

At the edge of the substrate 510, a terminal electrode is formed, and an FPC (flexible printed wiring board) 532 for connection to an external circuit is attached to this portion. Although the terminal electrode is a stack of a reflective metal film 530, a light-tiansmissive conductive oxide film 529, and a conductive oxide film extending from the second electrode, or a stack of a reflective metal film 527 and a light-transmissive conductive oxide film 526, the invention is not limited to this.

As a method for mounting the FPC 532, a connecting method using an anisotropic conductive material or a metal bump or a wire bonding method can be used. In FIG. 9, connection is carried out by using an anisotropic conductive adhesive material 531.

On the periphery of the pixel portion, an IC chip 523 in which a driver circuit for transmitting each signal to the pixel portion is formed is electrically connected with anisotropic conductive materials 524 and 525. In order to form a pixel portion corresponding to color display, 3072 data lines and 768 scan lines are required for the XGA display class. Such number of the data lines and scan lines are segmented per several blocks at an edge of the pixel portion, and then gathered in accordance with the pitch of output terminals of ICs.

This embodiment can be freely implemented in combination with Embodiment Mode or Embodiment 1.

Embodiment 3

Figure 10A:
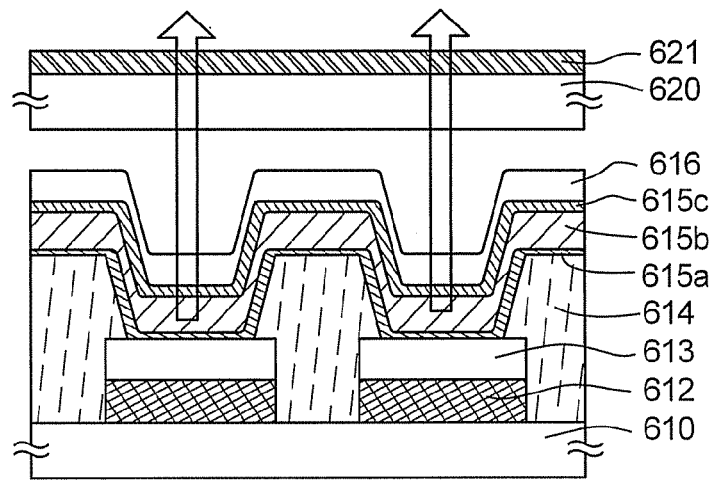
FIGS. 10A to 10C are cross-sectional views of a light-emitting module.

In this embodiment, description is made with reference to FIG. 10A on an example of providing an optical film.

Over a second substrate 620 provided to face a first substrate 610, an optical film 621 is provided. This embodiment illustrates an example where light is emitted in the direction shown by the arrows in FIG. 10A, specifically an example where light emitted from light-emitting elements passes through the second substrate 620 first and then through the optical film 621. However, the invention is not limited to this and the optical film may be provided on the first substrate side so that the light emitted from light-emitting elements passes through the optical film first and then through the first substrate 610.

The optical film 621 means a polarizing plate, a circularly polarizing plate (including an elliptically polarizing plate), a retardation plate (a λ/4 plate or a λ/2 plate) or an optical film such as a color filter.

A light-emitting element in a pixel of a passive matrix light-emitting device includes, similarly to Embodiment 1, a data line (anode) having a stacked-layer structure of a bottom layer 612 formed of a reflective metal film and a top layer 613 formed of a light-transmissive conductive oxide film, a first material layer 615a, a layer including an organic compound 615b, a second material layer 615c and a scan line (cathode) 616 formed of a light-transmissive conductive film. A partition wall 614 is formed of a resin material.

Note that each of the first material layer 615a and the second material layer 615c is a composite layer of a metal oxide (e.g., molybdenum oxide, tungsten oxide or rhenium oxide) and an organic compound (material having a hole transporting property). By adopting such a stacked-layer structure of a light-emitting element, a light-emitting element suitable for AC drive is obtained.

If a circulary polarizing plate is used as the optical film 621, it can be prevented that the visibility of images is decreased due to the external light reflected on the lower layer 612. Note that the circularly polarizing plate means a circularly polarizing plate (including an elliptically polarizing plate) which has a combination of a retardation plate or a retardation film having a phase-shifting property of, specifically, λ/4 or λ/4+λ/2, with a polarizing plate, a polarizing film or a linearly polarizing film. The λ/4 plate herein has a broad band and shifts the phase of visible light by 90 degrees. Specifically, the circularly polarizing plate defined herein is constructed in such a manner that the transmission axis of a polarizing plate and the phase-shifting axis of a retardation film make an angle of 45 degrees. Note that in this specification, the circulary polarizing plate includes a circularly polarizing film.

Additionally, full color display can be performed by using white light-emitting elements in combination with a color filter as the optical film 621.

Alternatively, several kinds of optical films may be appropriately combined.

This embodiment can be freely implemented in combination with Embodiment Mode, Embodiment 1 or Embodiment 2.

Embodiment 4

Figure 10B:
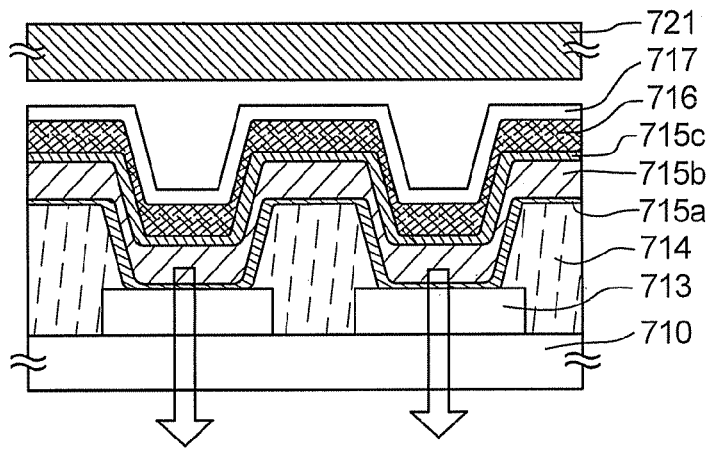

In this embodiment, description is made with reference to FIG. 10B on an example of a bottom-emission light-emitting device.

A light-emitting element in this embodiment includes a data line (anode) 713 formed of a light-transmissive conductive oxide film, a first material layer 715a, a layer including an organic compound 715b, a second material layer 715c, and a scan line (cathode) 716 formed of a reflective conductive film. A partition wall 714 is formed of a resin material similarly to Embodiment 3.

Note that each of the first material layer 715a and the second material layer 715c is a composite layer of a metal oxide (e.g., molybdenum oxide, tungsten oxide or rhenium oxide) and an organic compound (material having a hole transporting property). By adopting such a stacked-layer structure of a light-emitting element, a light-emitting element suitable for AC drive is obtained.

Light emitted from light-emitting elements is extracted in the direction of the arrows shown in FIG. 10B, specifically through a first substrate 710. Accordingly, a second substrate 721 is not specifically required to transmit light, and it may be a metal plate. A thick protective film 717 may be preferably provided in order to improve the reliability of the light-emitting element, since the light extraction efficiency is not decreased thereby.

This embodiment can be freely implemented in combination with any of Embodiment Mode, Embodiment 1, Embodiment 2 and Embodiment 3. For example, this embodiment may be combined with Embodiment 3, and in the case of providing an optical film, the optical film may be provided over the first substrate 710.

Embodiment 5

Figure 10C:
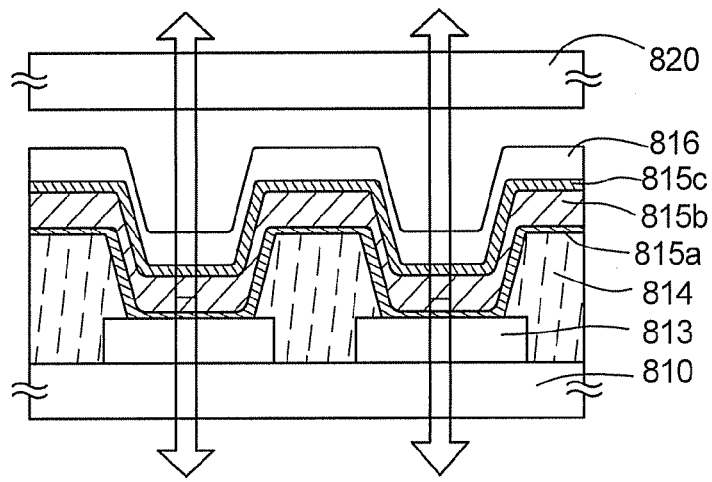

In this embodiment, description is made with reference to FIG. 10C on an example of a light-emitting device which is different from those in Embodiments 1 to 4.

A light-emitting element in this embodiment includes a data line (anode) 813 formed of a light-transmissive conductive oxide film, a first material layer 815a, a layer including an organic compound 815b, a second material layer 815c and a scan line (cathode) 816 formed of a light-transmissive conductive oxide film. A partition wall 814 is formed of a resin material similarly to Embodiment 3.

Note that each of the first material layer 815a and the second material layer 815c is a composite layer of a metal oxide (e.g., molybdenum oxide, tungsten oxide or rhenium oxide) and an organic compound (material having a hole transporting property). By adopting such a stacked-layer structure of a light-emitting element, a light-emitting element suitable for AC drive is obtained.

Light emitted from light-emitting elements is extracted in the direction of the arrows shown in FIG. 10C, specifically through both a first substrate 810 and a second substrate 820. Accordingly, each of the first substrate 810 and the second substrate 820 is formed of a light-transmissive substrate.

This embodiment can be freely implemented in combination with any of Embodiment Mode, Embodiment 1, Embodiment 2 and Embodiment 3. For example, this embodiment may be combined with Embodiment 3, and in the case of providing an optical film, the optical film may be provided over each of the first substrate 810 and the second substrate 820.

Embodiment 6

Figure 11:
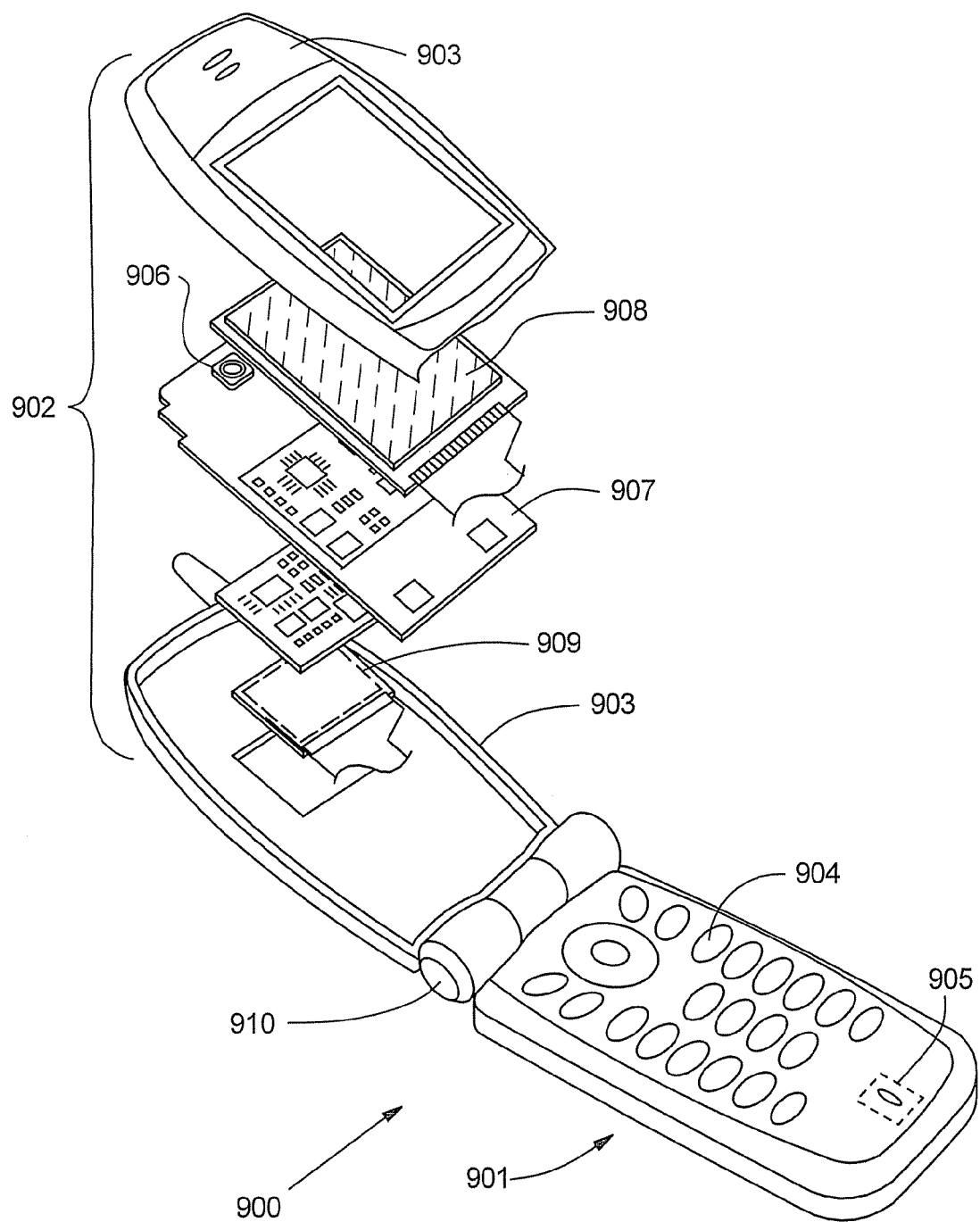
FIG. 11 illustrates an example of an electronic appliance.

The light-emitting device and electronic appliance of the invention includes a camera (e.g., a video camera or a digital camera), a navigation system, an audio reproducing system (e.g., car audio set or an audio component stereo), a personal computer, a game machine, a portable information terminal (e.g., a mobile computer, a portable phone, a portable game machine or an electronic book), an image reproducing device provided with a recording medium (specifically, a device for reproducing a recording medium such as a digital versatile disc (DVD) and having a display for displaying the reproduced image) and the like. FIGS. 11 and 12 show specific examples of such electronic appliances.

A portable phone shown in FIG. 11 includes a main body (A) 901 provided with an operating switch 904, a microphone 905 and the like, and a main body (B) 902 provided with a display panel (A) 908, a display panel (B) 909, a speaker 906 and the like, which are connected with a hinge 910 so that the portable phone can be opened or folded. The display panel (A) 908 and the display panel (B) 909 are incorporated into housings 903 of the main body (B) 902 together with a circuit board 907. Pixel portions of the display panel (A) 908 and the display panel (B) 909 are disposed so that they can be seen from open windows formed in the housings 903.

The specifications of the display panel (A) 908 and the display panel (B) 909 such as the number of pixels can be appropriately set in accordance with the function of the portable phone 900. For example, the display panel (A) 908 and the display panel (B) 909 can be used in combination so as to be used as a main display screen and a sub-display screen respectively.

The display panel (A) 908 has a structure shown in any one of Embodiments 1 to 5 so that AC drive can be performed. According to the invention, the total power consumption of the portable phone can be suppressed without causing an increase in the driving voltage even when the display panel (A) 908 is driven with AC voltage. Similarly, the display panel (B) 909 may also be driven with AC voltage, thereby the total power consumption of the portable phone can be suppressed without causing an increase in the driving voltage.

The portable phone of this embodiment can be changed into various modes in accordance with the function or applications. For example, by incorporating an image pick-up device into the hinge 910, a portable phone equipped with a camera can be provided. In addition, if the operating switch 904, the display panel (A) 908 and the display panel (B) 909 are incorporated into one housing, the aforementioned effect can be obtained. Further, if the structure of this embodiment is applied to an information display terminal having a plurality of display portions, a similar effect can be obtained.

Figure 12A:
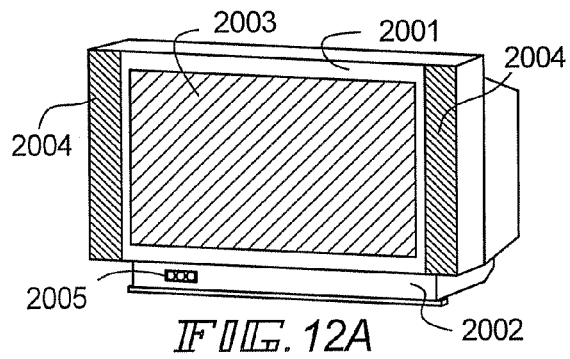
FIGS. 12A to 12G illustrate examples of an electronic appliance.

FIG. 12A is a television set including a housing 2001, a supporting base 2002, a display portion 2003, a speaker portion 2004, a video input terminal 2005 and the like. According to the invention, the display portion 2003 incorporated in the television set is driven with AC voltage, thereby a television with low power consumption can be provided. Note that the television set includes television sets for various information displays such as personal computers, TV broadcast reception and advertisement display.

Figure 12B:
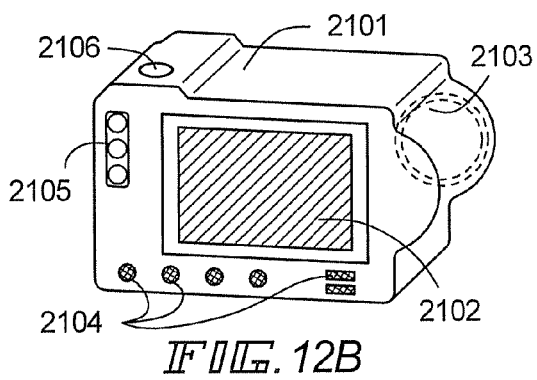

FIG. 12B is a digital camera which includes a main body 2101, a display portion 2102, an image receiving portion 2103, operating keys 2104, an external connection port 2105, a shutter 2106 and the like. According to the invention, the display portion 2102 incorporated in the digital camera is driven with AC voltage, thereby a digital camera with low power consumption can be provided.

Figure 12C:
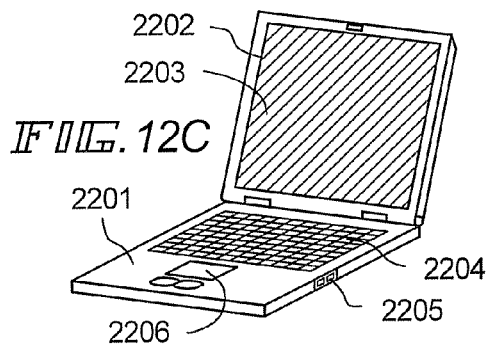

FIG. 12C is a personal computer which includes a main body 2201, a housing 2202, a display portion 2203, a keyboard 2204, an external connection port 2205, a pointing mouse 2206 and the like. According to the invention, the display portion 2203 incorporated in the personal computer is driven with AC voltage, thereby a personal computer with low power consumption can be provided.

Figure 12D:
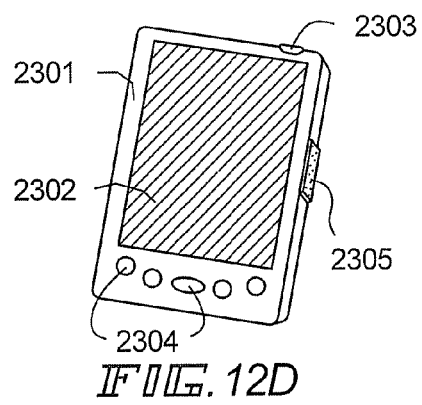

FIG. 12D is an electronic book which includes a main body 2301, a display portion 2302, a switch 2303, operating keys 2304, an IR port 2305 and the like. According to the invention, the display portion 2302 incorporated in the electronic book is driven with AC voltage, thereby an electronic book with low power consumption can be provided.

Figure 12E:
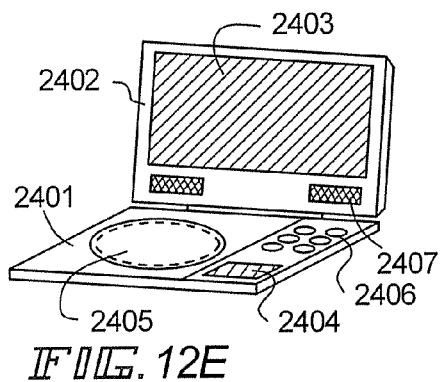

FIG. 12E is a portable image reproducing device provided with a recording medium (specifically, a DVD reproducing device), which includes a main body 2401, a housing 2402, a display portion 2403, a display portion 2404, a recording medium (eg., DVD) reading portion 2405, an operating key 2406, a speaker portion 2407 and the like. The display portion 2403 mainly displays image data while the display portion 2404 mainly displays text data. According to the invention, the display portions 2403 and 2404 incorporated in the image reproducing device are driven with AC voltage, thereby an image reproducing device with low power consumption can be provided.

Figure 12F:
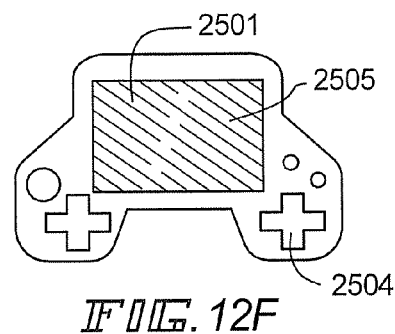

FIG. 12F is a portable game machine which includes a main body 2501, a display portion 2505, an operating switch 2504 and the like. According to the invention, the display portion 2505 incorporated in the game machine is driven with AC voltage, thereby a portable game machine with low power consumption can be provided.

Figure 12G:
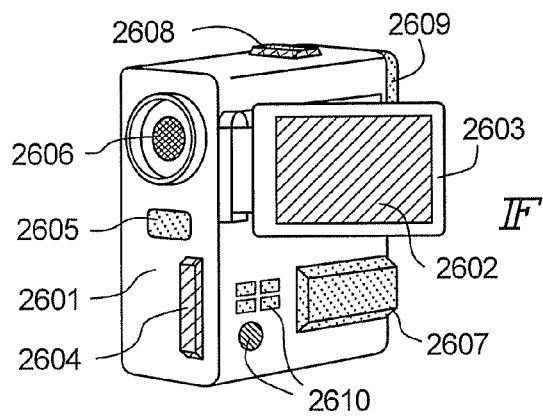
Figure 13:
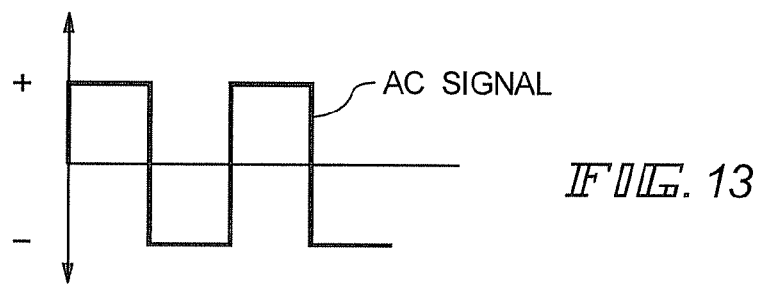
FIG. 13 is a graph showing an AC signal.

FIG. 12G is a video camera which includes a main body 2601, a display portion 2602, a housing 2603, an external connection port 2604, a remote controller receiving portion 2605, an image receiving portion 2606, a battery 2607, an audio input portion 2608, an eyepiece portion 2609, operating keys 2610 and the like. According to the invention, the display portion 2602 incorporated in the video camera is driven with AC voltage, thereby a video camera with low power consumption can be provided.

This embodiment can be freely implemented in combination with Embodiment Mode, Embodiment 1, Embodiment 2, Embodiment 3, Embodiment 4 or Embodiment 5.

According to the invention, the structure of an EL element using AC drive as well as a manufacturing process thereof can be simplified. Further, according to the invention, a pair of electrodes of an EL element can be controlled to be thick without causing an increase in the driving voltage; therefore, a short circuit of elements which derives from dust or the like in the formation process of the EL element can be suppressed, thereby the yield can be improved.

The present application is based on Japanese Priority application No. 2004-353427 filed on Dec. 6, 2004 with the Japanese Patent Office, the entire contents of which are hereby incorporated by reference.

What is claimed is:

1. A light-emitting device comprising:
    at least one light-emitting element including:
    a first electrode;
    a first material layer over the first electrode;
    a layer including an organic compound over the first material layer;
    a second material layer over the layer including the organic compound; and
    a second electrode over the second material layer,
    wherein the first material layer has symmetric current-voltage characteristics with respect to the zero point in a graph having the abscissa axis showing current values and the ordinate axis showing voltage values; and
    wherein the second material layer has the same current-voltage characteristic as the first material layer.

2. The light-emitting device according to claim 1, wherein each of the first material layer and the second material layer is a composite layer including a metal oxide and an organic compound.

3. The light-emitting device according to claim 2, wherein the metal oxide is one or more of molybdenum oxide, tungsten oxide and rhenium oxide.

4. The light-emitting device according to claim 1, further comprising a driver circuit for applying an alternate current signal between the first electrode and the second electrode.

5. The light-emitting device according to claim 1, which corresponds to an electronic appliance such as a video camera, a digital camera, a navigation system, a computer or a portable information terminal.

6. A light-emitting device comprising:
    at least two of light-emitting elements; and
    a partition wall between the light-emitting elements,
    wherein each of the light-emitting elements includes:

a first electrode;

a first material layer over the first electrode;

a layer including an organic compound over the first material layer;

a second material layer over the layer including the organic compound; and a second electrode over the second material layer, wherein the first material layer has symmetric current-voltage characteristics with respect to the zero point in a graph having the abscissa axis showing current values and the ordinate axis showing voltage values; and wherein the second material layer has the same current-voltage characteristic as the first material layer.

7. The light-emitting device according to claim 6, wherein each of the first material layer and the second material layer is a composite layer including a metal oxide and an organic compound.

8. The light-emitting device according to claim 7, wherein the metal oxide is one or more of molybdenum oxide, tungsten oxide and rhenium oxide.

9. The light-emitting device according to claim 6, further comprising a driver circuit for applying an alternate current signal between the first electrode and the second electrode.

10. The light-emitting device according to claim 6, which corresponds to an electronic appliance such as a video camera, a digital camera, a navigation system, a computer or a portable information terminal.

11. A light-emitting device comprising:

a first electrode disposed in a stripe form;

a first material layer over the first electrode;

a layer including an organic compound over the first material layer;

a second material layer over the layer including the organic compound; and a second electrode over the second material layer, the second electrode being disposed in a stripe form perpendicular to the first electrode, wherein the first material layer has symmetric current-voltage characteristics with respect to the zero point in a graph having the abscissa axis showing current values and the ordinate axis showing voltage values; and wherein the second material layer has the same current-voltage characteristic as the first material layer.

12. The light-emitting device according to claim 11, wherein each of the first material layer and the second material layer is a composite layer including a metal oxide and an organic compound.

13. The light-emitting device according to claim 12, wherein the metal oxide is one or more of molybdenum oxide, tungsten oxide and rhenium oxide.

14. The light-emitting device according to claim 11, further comprising a driver circuit for applying an alternate current signal between the first electrode and the second electrode.

15. The light-emitting device according to claim 11, which corresponds to an electronic appliance such as a video camera, a digital camera, a navigation system, a computer or a portable information terminal.

16. A light-emitting device comprising:

a first electrode disposed in a stripe form;

a first material layer over the first electrode;

a layer including an organic compound over the first material layer;

a second material layer over the layer including the organic compound; and a second electrode over the second material layer, the second electrode being disposed in a stripe form perpendicular to the first electrode, wherein the first material layer has symmetric current-voltage characteristics with respect to the zero point in a graph having the abscissa axis showing current values and the ordinate axis showing voltage values;

wherein the second material layer has the same current-voltage characteristic as the first material layer;

wherein the first electrode is formed using a light-reflective conductive material; and wherein the second electrode is formed using a light-transmissive conductive material.

17. The light-emitting device according to claim 16, wherein each of the first material layer and the second material layer is a composite layer including a metal oxide and an organic compound.

18. The light-emitting device according to claim 17, wherein the metal oxide is one or more of molybdenum oxide, tungsten oxide and rhenium oxide.

19. The light-emitting device according to claim 16, further comprising a driver circuit for applying an alternate current signal between the first electrode and the second electrode.

20. The light-emitting device according to claim 16, which corresponds to an electronic appliance such as a video camera, a digital camera, a navigation system, a computer or a portable information terminal.

* * * * *